US010353286B2

(12) United States Patent
Usui

(10) Patent No.: US 10,353,286 B2
(45) Date of Patent: Jul. 16, 2019

(54) IMPRINT METHOD, IMPRINT APPARATUS, AND ARTICLE MANUFACTURING METHOD

(71) Applicant: CANON KABUSHIKI KAISHA, Tokyo (JP)

(72) Inventor: Yoshiyuki Usui, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 361 days.

(21) Appl. No.: 14/859,510

(22) Filed: Sep. 21, 2015

(65) Prior Publication Data

US 2016/0096313 A1   Apr. 7, 2016

(30) Foreign Application Priority Data

Oct. 7, 2014   (JP) .................................. 2014-206675

(51) Int. Cl.
*G03F 7/00*   (2006.01)
*G03F 9/00*   (2006.01)

(52) U.S. Cl.
CPC .......... *G03F 7/0002* (2013.01); *G03F 9/7042* (2013.01)

(58) Field of Classification Search
CPC .................................................... G03F 7/0002
See application file for complete search history.

(56) References Cited

U.S. PATENT DOCUMENTS

| 2010/0148397 A1 | 6/2010 | Nakamura et al. |
| 2011/0074064 A1 | 3/2011 | Hayashi |
| 2011/0147970 A1 | 6/2011 | Sato |
| 2011/0290136 A1 | 12/2011 | Koga |
| 2012/0091611 A1 | 4/2012 | Yanagisawa |

(Continued)

FOREIGN PATENT DOCUMENTS

| CN | 103048879 A | 4/2013 |
| CN | 103135341 A | 6/2013 |
| JP | 2011097025 A | 5/2011 |

(Continued)

OTHER PUBLICATIONS

Office Action issued in Taiwanese Appln. No. 104129657 dated Dec. 7, 2016. English translation provided.

(Continued)

*Primary Examiner* — Larry W Thrower
(74) *Attorney, Agent, or Firm* — Rossi, Kimms & McDowell LLP

(57) ABSTRACT

An imprint method includes: before contacting a mold with an imprint material on a target shot region, obtaining relative position of the target shot region with respect to the mold, and performing first alignment between the target shot region and the mold by driving a correction unit configured to correct the relative position of the target shot region; after contacting the mold with the imprint material on the target shot region, performing second alignment between the target shot region and the mold by driving the correction unit; and performing the imprint process on the target shot region after the second alignment. The first alignment includes alignment performed based on a driving amount of the correction unit in the second alignment for another shot region where the imprint process has been performed earlier than in the target shot region.

9 Claims, 5 Drawing Sheets

(56) References Cited

U.S. PATENT DOCUMENTS

2012/0217675 A1* 8/2012 Usui ................ B82Y 10/00
264/293
2014/0272174 A1  9/2014 Furutono

FOREIGN PATENT DOCUMENTS

| JP | 2011146689 A | 7/2011 |
| JP | 2012084732 A | 4/2012 |
| JP | 2012178470 A | 9/2012 |
| JP | 2013084832 A | 5/2013 |
| JP | 2013098291 A | 5/2013 |
| KR | 1020130084255 A | 7/2013 |

OTHER PUBLICATIONS

Notice of Preliminary Rejection issued in Korean Application No. 10-2015-0136096 dated Nov. 20, 2018.
Office Action issued in Japanese Appln. No. 2014-206675 dated Sep. 14, 2018.
Office Action issued in Chinese Application No. 201510638839.2 dated Mar. 22, 2019. English translation provided.

* cited by examiner

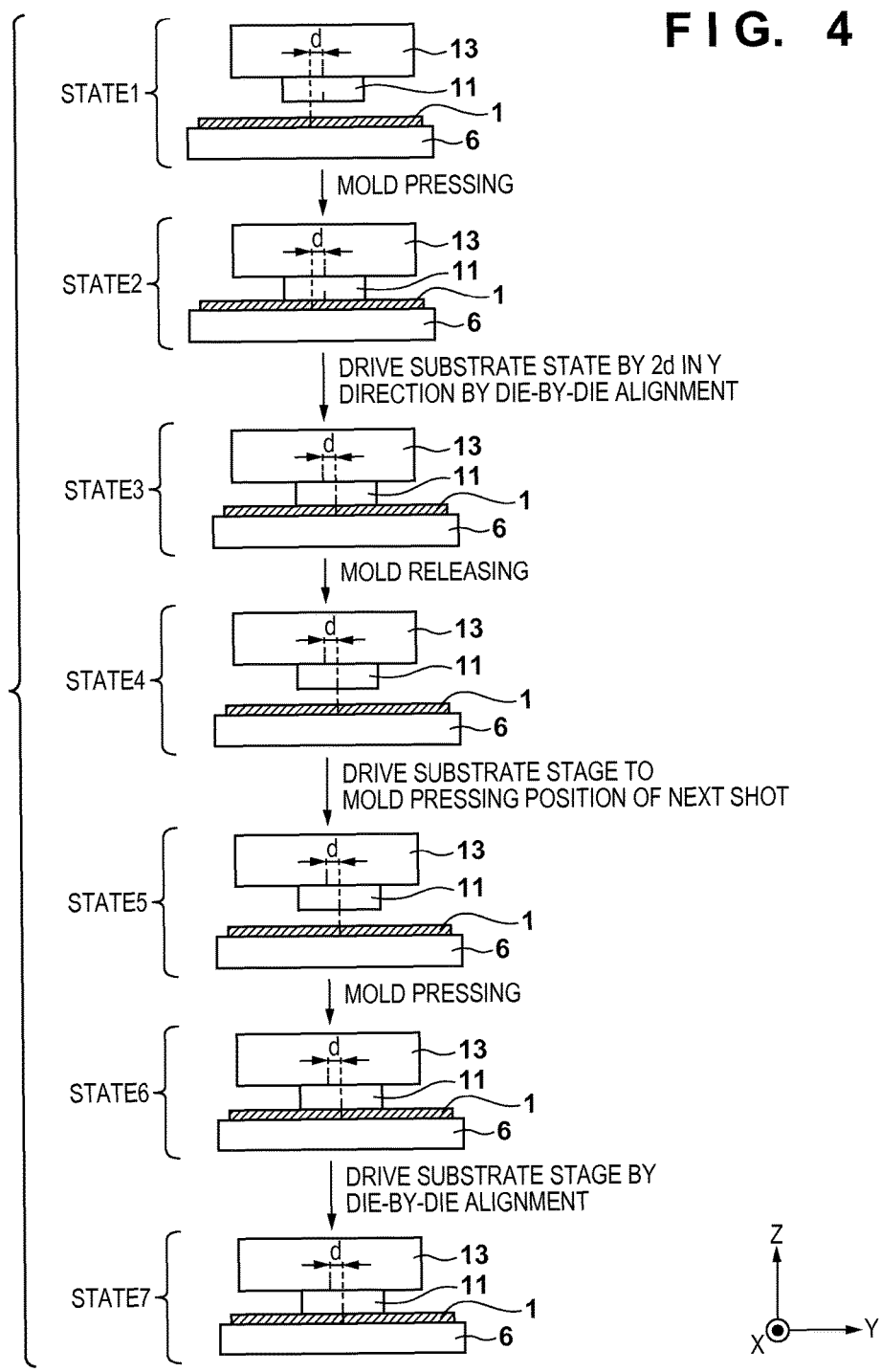

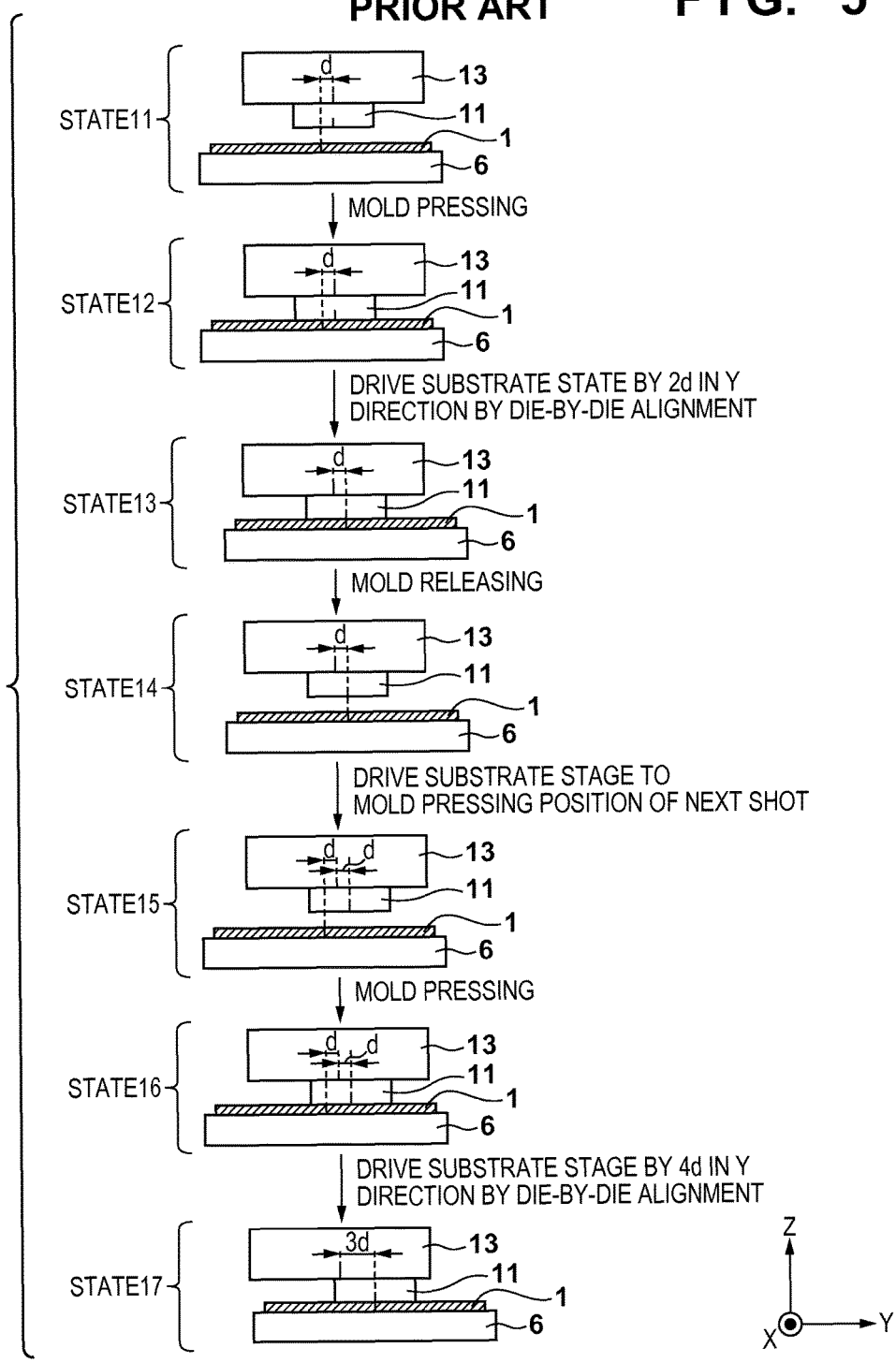

IMPRINT METHOD, IMPRINT APPARATUS, AND ARTICLE MANUFACTURING METHOD

BACKGROUND OF THE INVENTION

Field of the Invention

The present invention relates to an imprint method, an imprint apparatus, and an article manufacturing method.

Description of the Related Art

An imprint apparatus is coming into practical use as a lithography technique for mass production of magnetic storage media and semiconductor devices. An imprint technique is a method of forming a pattern on a substrate such as a silicon wafer or a glass plate by bringing a mold on which a fine circuit pattern has been formed and a resin applied onto the substrate into contact with each other.

For example, in forming the circuit patterns of the semiconductor devices, an overlay (alignment) accuracy between the circuit pattern which has already been formed on the substrate and the circuit pattern which is to be formed from now on is very important. The imprint apparatus using the imprint technique adopts a die-by-die alignment method as an alignment method between the substrate and the mold. In the die-by-die alignment method, for each imprint region where an imprint process is performed on the substrate, a substrate-side mark and a mold-side mark are optically detected to correct a deviation in the positional relationship between the mold and the substrate.

Japanese Patent Laid-Open No. 2012-084732 discloses a method of driving, based on the detection results of a substrate-side mark and a mold-side mark, a substrate stage so as to adjust the relative positions of a mold and an imprint region of the substrate after the mold and a resin on the substrate contact each other.

Unlike the pattern formation technique of a conventional projection optical system, the imprint technique performs die-by-die alignment such that the resin on the substrate and the mold contact each other when forming the patterns, and the relative positions of the substrate and the mold become small by driving the substrate stage. Since the resin on the substrate and the mold contact each other, the mold can be dragged by the driving of the substrate stage during die-by-die alignment and may deviate from its position with respect to an imprint head (mold holding unit). As the position deviation of the mold increases, the driving amount of alignment between the substrate and the mold during die-by-die alignment of a next shot becomes large. Furthermore, since the substrate and the mold contact each other, an amount by which the substrate and the mold can be aligned during die-by-die alignment is limited, and it takes much time for alignment.

Therefore, the position deviation between the substrate and the mold increases by repeating the imprint processes of forming the patterns on the substrate. As a result, alignment cannot be performed during die-by-die alignment or it takes much time even if alignment can be performed. Further, the mold-side mark or the substrate-side mark falls outside the field of view of an alignment scope as the position deviation between the substrate and the mold increases. As a result, the relative positions of the mold and the imprint regions may not be measured.

SUMMARY OF THE INVENTION

The present invention provides an imprint apparatus advantageous in throughput, and an overlay accuracy between a mold and a substrate.

The present invention in its first aspect provides an imprint method of performing an imprint process of forming a pattern of an imprint material by using a mold on each of a plurality of shot regions of a substrate, the method comprising: before bringing the mold and the imprint material on a target shot region for the imprint process into contact with each other, obtaining relative position between the target shot region and the mold, and performing first alignment between the target shot region and the mold by driving a correction unit configured to correct the relative position between the target shot region and the mold; after bringing the mold and the imprint material on the target shot region into contact with each other, performing second alignment between the target shot region and the mold by driving the correction unit; and performing the imprint process on the target shot region after the second alignment, wherein the first alignment includes alignment performed based on a driving amount of the correction unit in the second alignment for another shot region where the imprint process has been performed earlier than in the target shot region.

The present invention in its second aspect provides an imprint apparatus for performing an imprint process of forming a pattern of an imprint material by using a mold on each of a plurality of shot regions on a substrate, the apparatus comprising: a measurement device configured to measure relative position between the mold and each of the plurality of shot regions; a correction unit configured to correct the relative position of the shot regions and the mold; and a controller configured to control first alignment between a target shot region for the imprint process and the mold performed by driving the correction unit before bringing the mold and the imprint material on the target shot region into contact with each other, second alignment between the mold and the target shot region performed by driving the correction unit after bringing the mold and the imprint material on the target shot region into contact with each other, and the imprint process performed on the target shot region after performing the second alignment, wherein the controller is configured to perform the first alignment based on the relative positions of the target shot region measured by the measurement device and a driving amount of the correction unit in the second alignment for another shot region where the imprint process has been performed earlier than in the target shot region.

The present invention in its third aspect provides an article manufacturing method used in the imprint apparatus specified in the first aspect.

Further features of the present invention will become apparent from the following description of exemplary embodiments with reference to the attached drawings.

BRIEF DESCRIPTION OF THE DRAWINGS

FIG. 4 shows views of the positions of a substrate and a mold in the imprint processes of the present invention; and FIG. 5 shows views of the positions of the substrate and the mold in the imprint processes in the related art.

DESCRIPTION OF THE EMBODIMENTS

An embodiment of the present invention will be described in detail below with reference to the accompanying drawings.

[Imprint Apparatus]

Figure 1A:
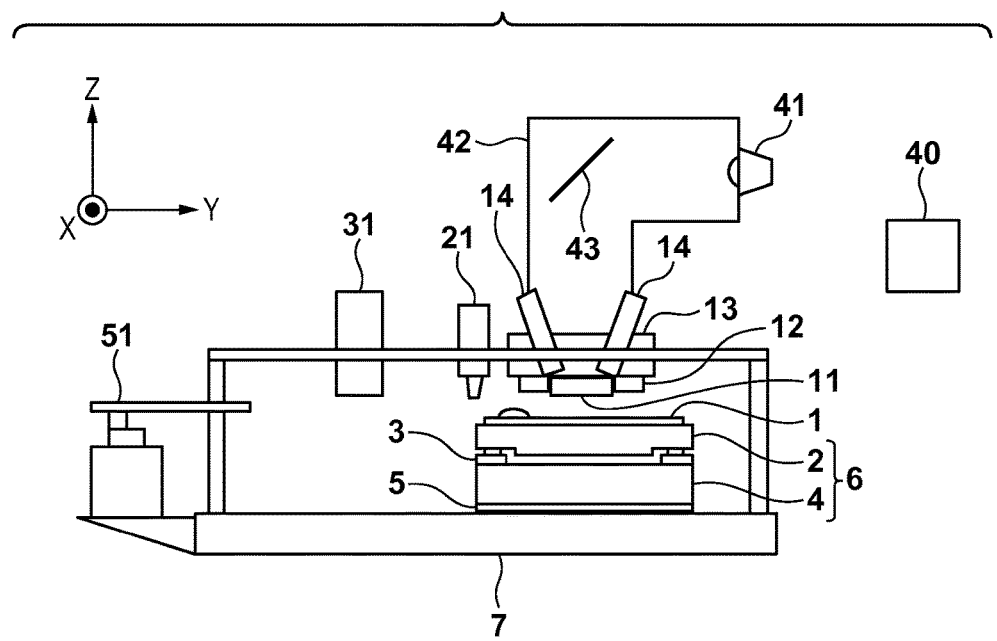
FIGS. 1A and 1B are views showing an imprint apparatus.

An example of an imprint apparatus which performs an imprint process of molding a pattern by using a mold on a resin (imprint material) supplied to each of a plurality of shot regions on a substrate will be described. FIG. 1A is a view showing the general outline of the imprint apparatus. The imprint apparatus according to this embodiment is a processing apparatus which forms the three-dimensional pattern of the mold (template) by transferring it onto the substrate serving as a target processing object used in a semiconductor device manufacturing step. The imprint apparatus according to this embodiment adopts a photo-curing method. Note that a description will be made by setting, in FIG. 1A, a Z-axis in parallel to the irradiation axis of ultraviolet rays with respect to the mold, a Y-axis in a direction in which a substrate stage moves toward a coating unit (to be described later) in a plane perpendicular to the Z-axis, and a X-axis in a direction perpendicular to the Y-axis. First, the imprint apparatus includes an irradiation unit 42, an imprint head (mold holding unit) 13 which holds a mold 11, a substrate stage 6 which holds a substrate 1, and a coating unit (dispenser) 21.

The irradiation unit 42 irradiates the mold 11 with the ultraviolet rays in the imprint process. The irradiation unit 42 includes a light source 41, a mirror 43 configured to bend the ultraviolet rays emitted from the light source so as to irradiate the mold 11, and a plurality of optical elements (not shown) configured to adjust the ultraviolet rays into light suitable for imprinting. The mold 11 includes, on a surface opposed to the substrate 1, a pattern region 11a in which a three-dimensional pattern such as a circuit pattern has been formed. The surface of the three-dimensional pattern is processed to have high flatness so as to maintain tight contact with the surface of the substrate 1. The mold 11 is made of a material such as quartz capable of transmitting the ultraviolet rays.

Figure 1B:
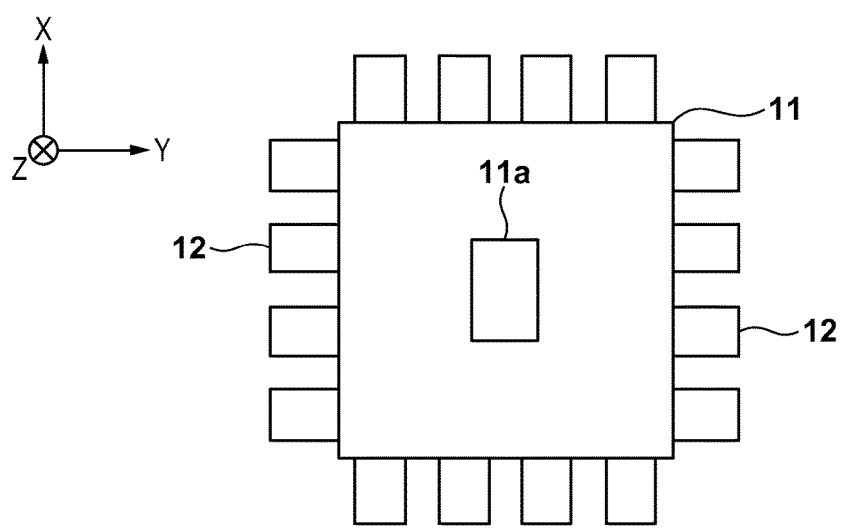

The imprint head (mold holding unit) 13 includes shape correction mechanisms 12 (mold correction mechanism) which can change the shape of the mold by applying a force to each side (side surface) of the mold 11, a plurality of scopes 14, a head (not shown) which holds and fixes the mold 11, and a driving mechanism (mold driving mechanism) which drives the imprint head 13. The driving mechanism can drive the imprint head 13 in the respective directions of Z, ωX, and ωY in order to bring the pattern region 11a of the mold 11 into contact with an ultraviolet-curing resin applied onto the substrate 1. As an actuator adopted for the driving mechanism, it is possible to adopt a linear motor or an air cylinder. Alternatively, when performing a mold releasing operation of separating the mold 11 from the ultraviolet-curing resin, there may be used an actuator which can perform a coarse operation and a fine operation dividedly in order to perform the mold releasing operation accurately so as not to damage a cured resin. FIG. 1B shows the arrangement of the shape correction mechanisms 12. FIG. 1B is a view of the mold 11 when viewed from a bottom surface. The mold 11 includes the pattern region 11a in which the three-dimensional pattern has been formed.

The plurality of shape correction mechanisms 12 are arranged in the respective sides of the mold 11. Each shape correction mechanism 12 is an actuator that can change the entire mold 11 and the shape (for example, the magnification) of the pattern region 11a by applying a force onto a contact surface with the mold 11. As the actuator adopted here, it is possible to adopt a linear motor, an air cylinder, a piezoelectric actuator, or the like. FIG. 1B shows an example in which four actuators are arranged for each side of the mold 11. However, the number of actuators arranged for each side in the actual imprint apparatus is not particularly limited. Each scope 14 is a measurement device which optically observes a mold-side mark 63 and a substrate-side mark 62, and measures their relative positions. Since each scope 14 suffices to be able to measure the relative positions of the mold 11 and the substrate 1, it may be a scope internally arranged with an imaging optical system which observes their images, or may be a scope which can detect their interference signals or signals obtained by a synergistic effect such as moiré (interference fringes).

The substrate 1 is, for example, a substrate which is made of single-crystal silicon and on which the imprint process should be performed. The target processing surface of the substrate 1 is coated with the uncured ultraviolet-curing resin. The substrate stage 6 is a stage drivable in the X, Y, and Z directions, and includes a fine moving stage 2 and a coarse moving stage 4. The fine moving stage 2 can finely be driven, by a fine moving actuator 3, in the respective directions of X, Y, Z, ωX, ωY, and ωZ, and holds the substrate 1 via a substrate chuck (not shown). The coarse moving stage 4 can be driven, by a coarse moving actuator 5, in the respective directions of X, Y, and ωZ while holding the fine moving stage 2, and is installed on a stage platen 7 placed on the floor surface. To simplify the arrangement of the substrate stage 6 while ensuring its rigidity, it is also possible to integrate the fine moving stage 2 and the coarse moving stage 4, and set only the X, Y, and ωZ directions as the driving directions.

The coating unit 21 coats a predetermined region on the substrate 1 with an ultraviolet-curing resin (imprint material) 22. The ultraviolet-curing resin 22 is a resin (imprint material) having the property of curing by receiving the ultraviolet rays. The type of resin (imprint material) used in the imprint process is selected appropriately depending on the type of semiconductor device to be manufactured. The wavelength of light emitted by the irradiation unit 42 is determined appropriately in accordance with the type of resin. The imprint apparatus includes an alignment detector 31 configured to position the substrate 1, a conveying system configured to load and unload the mold 11 and the substrate 1 to and from the imprint apparatus, and a controller 40. The alignment detector 31 is a measurement device which measures the position deviation in the substrate 1 or the like in the X and the Y directions. The conveying system includes a mold conveying system (not shown) configured to load and unload the mold 11, and a substrate conveying system 51 configured to load and unload the substrate 1. The mold conveying system includes a conveying robot, and performs conveyance between the imprint head 13 and a mold stocker installed in a predetermined position. The mold stocker is a carrier which internally stocks the plurality of molds 11. The substrate conveying system 51 performs, by the conveying robot, conveyance between the substrate stage 6 and the substrate carrier (not shown) placed in a predetermined substrate inlet.

The controller 40 controls the operation, the adjustment process, and the like of each component of the imprint apparatus. The controller 40 is constituted by a computer, a sequencer, or the like (not shown) including a magnetic storage media or the like connected to each component of the imprint apparatus by a circuit, and controls each component by a program or a sequence.

[Imprint Process]

The imprint process of forming the pattern on the substrate by bringing the resin 22 on the substrate and the mold 11 into contact with each other will now be described briefly.

First, the substrate conveying system 51 conveys the processing target substrate 1 from the substrate carrier to the substrate chuck. The mold conveying system conveys the mold 11 designated by a lot from the mold stocker to the imprint head 13 and fixes it to a head.

Next, the controller 40 performs prealignment measurement in order to measure the relative positions of the mold 11 and each shot within the substrate 1. The controller 40 measures the respective positions of the substrate 1 and the mold 11 individually with reference to device coordinates by using the alignment detector 31 and the scopes 14. Each scope 14 measures the position of the mold 11 with the position reference of the scope 14 by observing the mold-side mark 63. On the other hand, the substrate stage 6 which holds the substrate 1 moves immediately under the alignment detector 31, and the alignment detector 31 measures the position of each shot within the substrate 1 with the reference of the substrate stage 6 by measuring a plurality of marks on the substrate 1.

Figure 2A:
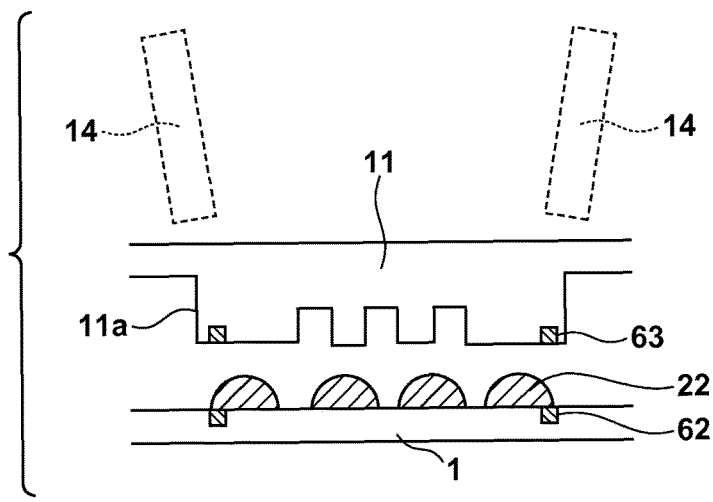
FIGS. 2A to 2C are views for explaining imprint processes.
Figure 2B:
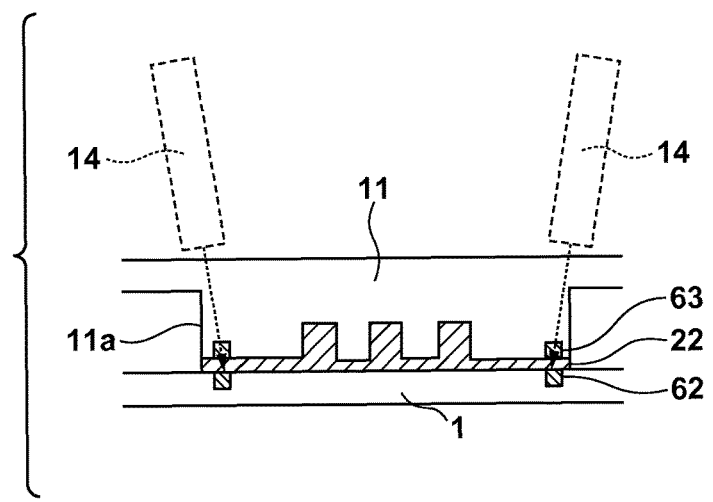

Then, the substrate stage 6 moves immediately under the coating unit 21, and the coating unit 21 coats, with the resin 22, each shot region on the substrate 1 where the imprint process is performed. After that, each shot region coated with the resin 22 on the substrate 1 by driving the substrate stage 6 is arranged in a predetermined position immediately under the imprint head 13. FIG. 2A shows a positional relationship at this time. The imprint head 13 brings the pattern region 11a arranged on the mold 11 into contact with the resin 22 on the substrate 1 (mold pressing operation) by driving the mold 11 in the Z direction. At this time, the resin 22 flows along the three-dimensional pattern formed in the pattern region 11a on the mold 11 by pressing the mold 11. FIG. 2B shows a positional relationship at this time. Furthermore, the substrate-side marks 62 and the mold-side marks 63 are observed simultaneously by the scopes 14, the substrate stage 6 and the shape correction mechanisms 12 are driven to correct the relative position deviation of the marks, and alignment is performed such that a relative position deviation amount falls within a predetermined tolerance.

Figure 2C:
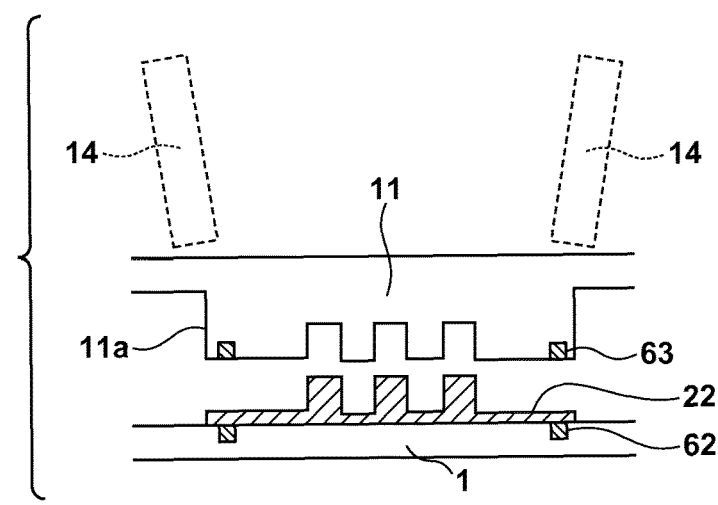

This alignment operation is referred to as die-by-die alignment. In a state in which the mold 11 and the resin 22 contact each other, the irradiation unit 42 emits the ultraviolet rays from the back surface of the mold 11 (the upper surface of the imprint apparatus) and the resin 22 is cured by the ultraviolet rays that have passed through the mold 11. After the resin 22 is cured, the imprint head 13 widens the spacing between the substrate 1 and the mold 11, thereby separating the mold 11 from the cured resin 22 (mold releasing operation). As a result, the layer of the resin 22 having a three-dimensional shape conforming to the pattern of the pattern region 11a is formed on the surface of the substrate 1. FIG. 2C shows a positional relationship at this time. Then, the imprint apparatus sequentially drives the substrate stage 6 and repeats the imprint processes for all the shot regions designated by the lot, thereby transferring the three-dimensional patterns over the entire surface of the substrate 1.

[Die-by-Die Alignment]

Alignment between the substrate 1 and the mold 11 is performed by die-by-die alignment performed in the imprint processes. However, since the mold 11 and the resin 22 on the substrate 1 contact each other during die-by-die alignment, the amount by which alignment can be performed is limited and it takes much time for alignment. It is therefore necessary to reduce the amount of alignment between the substrate 1 and the mold 11 during die-by-die alignment. To achieve this, a method in Japanese Patent Laid-Open No. 2012084732 is used to determine, from the prealignment measurement result of the substrate 1 and the mold 11, the driving amounts of the substrate stage 6 and the shape correction mechanisms 12 before mold pressing, and drive the substrate stage 6 and the shape correction mechanisms 12 prior to mold pressing. This makes it possible to reduce the alignment amount during die-by-die alignment.

However, determining the driving amount of the substrate stage 6 before mold pressing only from the prealignment measurement result alone is not enough. Because the substrate stage 6 is driven in the state in which the mold 11 and the resin 22 on the substrate 1 contact each other during die-by-die alignment, the mold 11 is dragged by the substrate 1, resulting in the relative position deviation between the imprint head 13 and the mold 11. In this case, the relative positions of the imprint head 13 and the mold 11 differ between the time of prealignment measurement and after the imprint processes. Therefore, if the pre-driving amount of the substrate stage 6 for the next shot region is calculated only from the prealignment measurement result of the substrate 1, the amount of alignment between the substrate 1 and the mold 11 in die-by-die alignment becomes large.

(Related Art)

A related art in which the mold 11 deviates with respect to the imprint head 13 will be described. FIG. 5 shows views of the positions of the substrate 1 and the mold 11 at the time of the imprint processes in the related art. A description will be made by letting the Z-axis be a direction in which the imprint head 13 is driven and the XY-axis be directions perpendicular to each other and in which the substrate stage 6 is driven. The substrate stage 6 holds the substrate 1 and the imprint head 13 holds the mold 11.

State 11 represents a state before the mold pressing operation of the first shot. The mold 11 and the resin 22 on the substrate 1 are in a noncontact state. The prealignment measurement result of the substrate 1 and the mold 11 includes a measurement error. Therefore, the relative position deviation occurs between the substrate 1 and the mold 11 when the substrate 1 is driven to be under the mold 11 in advance. In an example of FIG. 5, the substrate 1 deviates with respect to the mold 11 by d in the −Y direction. The state changes from state 11 to state 12 by driving the imprint head 13 in the −Z direction. In state 12, the substrate 1 and the mold 11 contact each other via the resin 22. The state changes from state 12 to state 13 by performing die-by-die alignment to move the substrate 1.

Assume that by moving the substrate 1 during die-by-die alignment, the mold 11 deviates with respect to the imprint head 13 by 50% of the moving amount of the substrate 1. When the state changes from state 12 to state 13, the mold 11 deviates with respect to the imprint head 13 by d by moving the substrate 1 by 2d in the +Y direction during die-by-die alignment. Consequently, the relative positions of the mold 11 and the substrate 1 are corrected by d (=2d−d) when the state changes from state 12 to state 13. The relative position between the substrate 1 and the mold 11 before die-by-die alignment was deviated by d in the −Y direction. With die-by-die alignment, the relative positions of the substrate 1 and the mold 11 are corrected by d in the +Y direction. As a result, the relative position deviation between the substrate 1 and the mold 11 is eliminated.

The state changes from state 13 to state 14 by driving the imprint head 13 in the +Z direction to perform mold releasing. The state changes from state 14 to state 15 by driving the substrate 1 to the mold pressing position of the second shot. In the example of FIG. 5, it is determined from the prealignment result of the substrate 1 that the Y position of the first shot and that of the second shot are equal to each other. Therefore, the position of the substrate stage 6 in the Y direction in state 11 (before mold pressing of the first shot) and that in state 15 (before mold pressing of the second shot) are equal to each other. On the other hand, the mold 11 deviates with respect to the imprint head 13 by d in state 15, as compared with state 11. Therefore, the relative position deviation amount of the substrate 1 and the mold 11 is 2d in state 15 while it is d in state 11. The state changes from state 15 to state 16 by performing mold pressing. Similarly, the relative position deviation amount of the substrate 1 and the mold 11 is 2d in state 16 while it is d in state 12.

The state changes from state 16 to state 17 by performing die-by-die alignment to move the substrate 1 in the Y direction. Since the relative deviation between the substrate 1 and the mold 11 before die-by-die alignment is 2d, the substrate 1 is moved by 4d in the +Y direction by performing die-by-die alignment to correct the relative position deviation. At this time, the mold 11 further deviates with respect to the imprint head 13 by 2d. As a result, the relative deviation between the imprint head 13 and the mold 11 becomes 3d. That is, in order to align the mold 11 and the substrate 1 by die-by-die alignment, the substrate 1 is moved by 4d in the second shot while it is moved by 2d in the first shot. The moving amount of the substrate 1 is larger in the second shot.

In the above-described example, it has been assumed that by moving the substrate 1 during die-by-die alignment, the mold 11 deviates with respect to the imprint head 13 by 50% of the moving amount. The actual deviation amount of the mold 11 by die-by-die alignment varies depending on, for example, the three-dimensional pattern or the resist characteristic of the mold 11, or an adsorption pressure at which the imprint head 13 adsorbs the mold 11. When the mold 11 deviates, regardless of the deviation amount of the mold 11, with respect to the imprint head 13 by die-by-die alignment, the amount of alignment between the substrate 1 and the mold 11 during die-by-die alignment of the next shot increases in accordance with the position deviation amount of the mold 11. That is, in the related art, the amount of alignment between the substrate 1 and the mold 11 increases each time the imprint processes are repeated. If the alignment amount increases, alignment cannot be performed by die-by-die alignment or it takes much time for alignment.

(Die-by-Die Alignment of Present Invention)

Figure 3:
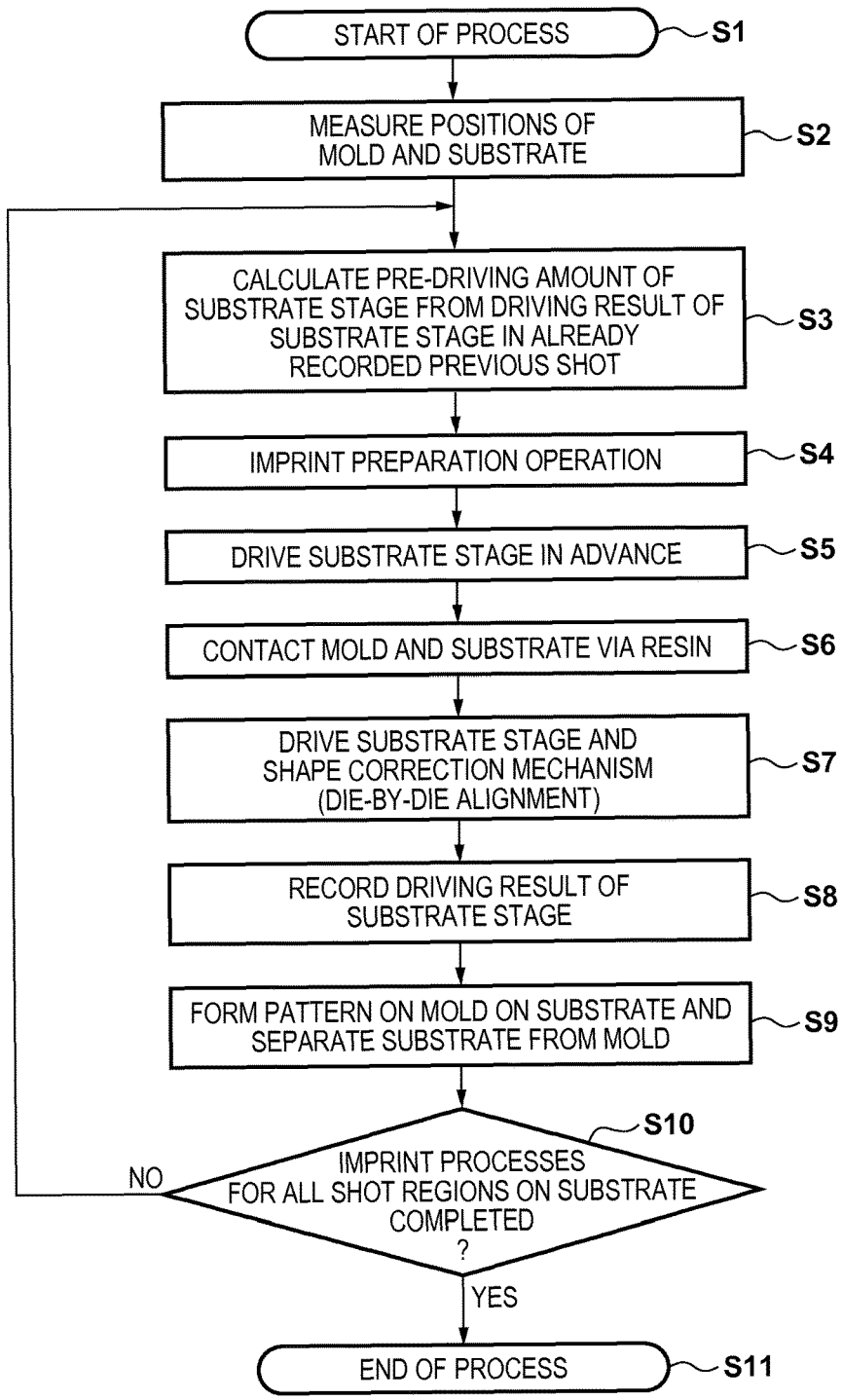
FIG. 3 is a flowchart for explaining the imprint processes of the present invention.

An imprint process including die-by-die alignment of the present invention which solves the problem of die-by-die alignment in the above-described related art will now be described with reference to FIG. 3. First, the process starts in step S1. In step S2, the controller 40 aligns and measures the substrate 1 and the mold 11 in advance by individually measuring the substrate 1 and the mold 11, respectively, with reference to the device coordinate. More specifically, the marks on the mold 11 are observed by the scopes 14, and mark positions are measured with the position references of the scopes 14 or mark reference on the substrate stage 6. By observing the plurality of marks on the mold 11, it is possible to measure not only the position of the mold 11 but also the magnification component of the mold 11. Next, a statistical process for observing, by the alignment detector 31, the one or the plurality of marks in some shot regions (sample shots) on the substrate 1 and estimating the position coordinates of all the shot regions on the substrate 1 is performed (global alignment). Coarse alignment (prealignment) or baseline measurement using a reference mark on the substrate stage 6 may be performed in advance in order to increase the efficiency and the accuracy of global alignment measurement.

In step S3, the controller 40 calculates the pre-driving position of the substrate stage 6. Let $(X(n), Y(n))$ be the pre-driving position of the substrate stage 6 in the nth shot. Let $(Xp(n), Yp(n))$ be the position of the substrate stage 6 obtained from the prealignment measurement result in step S2 and for driving the nth-shot of the substrate 1 to be under of the mold 11. Let $(Xr(n), Yr(n))$ be the driving result of the substrate stage 6 in die-by-die alignment of the nth shot recorded in step S8. Consequently, following equations (1) and (2) hold by using the result of the shot ((n−1)th shot) having the immediately preceding order of the imprint processes on the same substrate 1.

$$X(n)=Xp(n)+Xr(n-1)-Xp(n-1) \qquad (1)$$

$$Y(n)=Yp(n)+Yr(n-1)-Yp(n-1) \qquad (2)$$

When calculating a pre-driving position $(X(1), Y(1))$ of the substrate stage 6 in the first shot, it is possible to handle $Xp(0), Yp(0), Xr(0)$, and $Yr(0)$ as 0 or to use the value of the final shot of the substrate 1 that has been processed previously. In step S4, the controller 40 performs a preparation operation of, for example, coating an imprint process target region with the resin 22. More specifically, the controller 40 coats the entire surface of an imprint process target shot region with the resin 22 by driving the substrate stage 6 to a coating start position immediately under the coating unit 21, and performing dispensing of the resin 22 and scan driving of the substrate stage 6 simultaneously. After the coating of the resin 22 has completed, the controller 40 drives the substrate stage 6 to move the target shot region immediately under the mold 11. At this time, the controller 40 corrects, by using the measurement result in step S2, the driving position of the substrate stage 6, and the position and the shape of the mold 11. At this time, the controller 40 performs alignment in the X and the Y directions by XY-driving the substrate stage 6, and performs rotation alignment between the mold 11 and the shot regions by rotatably driving the substrate stage 6.

In step S5, the controller 40 drives the substrate stage 6 to the position calculated in step S3 in advance. In FIG. 3, steps S4 and S5 are described separately. However, a calculation result in step S3 may be reflected in the final driving position of the substrate stage 6 in step S4 in order to reduce a time required for alignment and increase the productivity of the apparatus. This makes it possible to eliminate pre-driving of the substrate stage 6 in step S5 and to reduce an imprint process time.

In step S6, the controller 40 brings the substrate 1 and the mold 11 into contact with each other via the resin 22 by driving the imprint head 13 downward in the Z direction. In this embodiment, the substrate stage 6 may be driven in advance before contacting the mold 11 and the substrate 1 or the substrate stage 6 may be driven to the position calculated in step S3 immediately after contacting the mold 11 and the substrate 1. The driving amount of the substrate stage 6 at this time is the driving amount for correcting alignment. In step S7, the controller 40 observes the mold-side mark 63 and the substrate-side mark 62 simultaneously, measures the relative position deviation amount, and performs alignment, that is, die-by-die alignment by driving the substrate stage 6 and the shape correction mechanisms 12 such that the relative position deviation amount falls within the predetermined tolerance. If the mold 11 deviates with respect to the imprint head 13 during die-by-die alignment, the controller 40 further drives the substrate stage 6 to correct a deviation amount.

In step S8, the controller 40 records, as the driving result (Xr(n), Yr(n)), the position of the substrate stage 6 after finishing die-by-die alignment of the nth shot. In step S3 in the succeeding (n+1)th shot, the controller 40 calculates a pre-driving position (X(n+1), Y(n+1)) of the substrate stage 6 by using the recorded driving result (Xr(n), Yr(n)) of the substrate stage 6. The driving result (Xr(n), Yr(n)) of the substrate stage 6 also includes the amount obtained by correcting the deviation amount of the mold 11 with respect to the imprint head 13. Therefore, even if the position deviation of the mold 11 with respect to the imprint head 13 occurs, the controller 40 can drive the substrate 1 to a position where the position deviation of the mold 11 has been corrected in step S5 in the next shot.

In step S9, the controller 40 cures the resin 22 by irradiating it with the ultraviolet rays and transfers the three-dimensional pattern of the mold 11 onto the substrate 1. Then, the controller 40 drives upward the imprint head 13 which holds the mold 11 in the Z direction to widen the spacing between the substrate 1 and the mold 11, thereby separating the substrate 1 from the mold 11 (mold releasing operation). In step S10, the controller 40 determines whether pattern formation in all the shot regions on the substrate is complete. If the imprint processes for all the shot regions are not complete, the process returns to step S3 and continues the imprint process for the next shot region. If the imprint processes for all the shot regions are complete, the process advances to step S11 and terminates the imprint processes for the one substrate 1.

The positional relationship between the substrate 1 and the mold 11 when using die-by-die alignment in the present invention will now be described with reference to FIG. 4. As in FIG. 5, a description will be made by letting the Z-axis be the direction in which the imprint head 13 is driven and the XY-axis be the directions perpendicular to each other in which the substrate stage 6 is driven. The substrate stage 6 holds the substrate 1 and the imprint head 13 holds the mold 11. State 1 to state 4 in FIG. 4 are the same as state 11 to state 14 in FIG. 5. State 1 represents a state before mold pressing of the first shot. In state 1, the mold 11 and the resin 22 on the substrate 1 are in the noncontact state. State 2 is obtained by driving the imprint head 13 in the −Z direction (downward in the Z direction) from the state of state 1 and performing mold pressing. In state 2, the mold 11 and the substrate 1 physically contact each other via the resin 22.

The state changes from state 2 to state 3 by performing die-by-die alignment to drive the substrate 1. Assume that by driving the substrate 1 during die-by-die alignment, the mold 11 deviates with respect to the imprint head 13 by 50% of the driving amount of the substrate 1. When the state changes from state 2 to state 3, the mold 11 deviates with respect to the imprint head 13 by d by driving the substrate 1 by 2d in the +Y direction during die-by-die alignment. Consequently, the relative positions of the mold 11 and the substrate 1 are corrected by d (=2d−d). The relative deviation between the substrate 1 and the mold 11 before die-by-die alignment exists by d in the −Y direction, and the relative positions of the substrate 1 and the mold 11 are corrected by d in the +Y direction by die-by-die alignment. As a result, the relative deviation between the substrate 1 and the mold 11 is eliminated.

The state changes from state 3 to state 4 by driving the imprint head 13 in the +Z direction (upward in the Z direction) to perform mold releasing. The state changes from state 4 to state 5 by driving the substrate 1 to the mold pressing position of the second shot. The pre-driving position of the substrate stage 6 in the second shot can be obtained, by using the substrate stage positions of the first shot and the second shot calculated from the prealignment measurement result and the driving result of the substrate stage 6 in die-by-die alignment of the first shot, from:

$$X(2)=Xp(2)+Xr(1)-Xp(1) \qquad (3)$$

$$Y(2)=Yp(2)+Yr(1)-Yp(1) \qquad (4)$$

wherein let (X(2), Y(2)) be the pre-driving position of the substrate stage 6 in the second shot, (Xp(1), Yp(1)) be the substrate stage position of the first shot, (Xp(2), Yp(2)) be the substrate stage position of the second shot, and (Xr(1), Yr(1)) be the driving result of the substrate stage in die-by-die alignment of the first shot.

In FIG. 4, as in FIG. 5, it is determined from the prealignment result of the substrate 1 that the Y position on the substrate of the first shot and that of the second shot are equal to each other. Therefore, Yp(1)=Yp(2) holds and equation (4) will be Y(2)=Yr(1). That is, the Y position of the substrate stage 6 in state 5 and that in state 4 are equal to each other. In practice, the substrate stage 6 is driven in the X direction when the state changes from state 4 to state 5, and the driving error of the substrate stage 6 along with that driving occurs by several nm to several hundred nm in the Y direction as well. Therefore, the Y position of the substrate stage 6 in state 5 deviates from that in state 4 by several nm to several hundred nm.

The state changes from state 5 to state 6 by performing mold pressing. The state changes from state 6 to state 7 by performing die-by-die alignment to drive the substrate 1. In state 7 of FIG. 4, the driving amount of the substrate stage during die-by-die alignment is not shown. In practice, however, the substrate stage 6 is driven in order to correct the several-nm to several-hundred-nm driving error of the substrate stage 6 when the state changes from state 4 to state 5. On the other hand, the position deviation further including the position deviation of the mold 11 with respect to the imprint head 13 which has occurred at the time of die-by-die alignment of the first shot is corrected by driving, in advance, the substrate stage 6 to the mold pressing position of the second shot. Therefore, the amount of alignment between the substrate 1 and the mold 11 during die-by-die alignment of the second shot never becomes large by the position deviation amount of the mold 11 with respect to the imprint head 13.

When performing the imprint processes of the present invention as described above, the relative positions of the substrate 1 and the mold 11 before mold pressing can be smaller by driving the substrate stage 6 in advance in the next shot even if the position deviation of the mold 11 with respect to the imprint head 13 occurs during die-by-die alignment. It is therefore possible to reduce the alignment amount during die-by-die alignment, and to form the pattern without decreasing the productivity while maintaining a good overlay accuracy even if the imprint processes are repeated.

Another example of an imprint method will now be described. In the above-described embodiment, the method of correcting the position deviation of the mold 11 with respect to the imprint head 13 by driving the substrate stage 6 in advance when the position deviation occurs has been described. Similarly, the position deviation of the substrate 1 with respect to the substrate stage 6 can be corrected by driving the substrate stage 6 in advance even if the position deviation occurs. Further, it is also possible to correct, by driving the substrate stage 6 in advance, not only a position deviation in a shift component between the substrate 1 and the mold 11 but also a rotation component.

Furthermore, in order to correct a shape change between the substrate 1 and the mold 11 caused by heat of ultraviolet irradiation or the like at the time of the imprint processes, it is also possible to correct a magnification component by driving the shape correction mechanisms 12 in advance. In this case, the controller 40 calculates the pre-driving amount of the next shot from the driving amount of the previous shot during die-by-die alignment not only for the substrate stage 6 but also for the shape correction mechanisms 12 in step S3, and performs pre-driving in step S5. When correcting a magnification change between the substrate 1 and the mold 11, correction may be performed by using a method of applying a force to the mold 11 by the shape correction mechanisms 12 shown in FIG. 2B, or by changing the shape of the substrate 1 or the mold 11 by applying heat to the substrate 1 or the mold 11. Further, when the position deviation of the mold 11 with respect to the imprint head 13 occurs, not the substrate stage 6 but the imprint head 13 may be driven. In the present invention, the driving mechanism of the substrate stage 6, the driving mechanism of the imprint head 13, and the shape correction mechanisms 12 constitute a correction unit which corrects the position deviation between the target shot region and the mold 11.

In the description so far, the controller 40 determines the driving amounts of the substrate stage 6 and the shape correction mechanisms 12 in the next shot from the driving results of the substrate stage 6 and the shape correction mechanisms 12 in the previous shot. However, the controller 40 may perform the statistical process from the driving results of the substrate stage 6 and the shape correction mechanisms 12 in the plurality of shots before the previous shot, and may determine the driving amounts of the substrate stage 6 and the shape correction mechanisms 12 in the next shot.

[Article Manufacturing Method]

A manufacturing method of a device (a semiconductor integrated circuit device, a liquid crystal display device, an MEMS, or the like) as an article includes a step of transferring (forming) a pattern onto a substrate (a wafer, a glass plate, a film-like substrate, or the like) using the above-described imprint apparatus. The manufacturing method can also include a step of etching the substrate onto which the pattern has been transferred. Note that when manufacturing another article such as a patterned media (storage medium) or an optical element, the manufacturing method can include, instead of the etching step, another processing step of processing the substrate onto which the pattern has been transferred.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2014-206675, filed Oct. 7, 2014, which is hereby incorporated by reference herein in its entirety.

What is claimed is:

1. An imprint method of performing an imprint process of forming a pattern of an imprint material by using a mold on each of a plurality of shot regions of a substrate, the method comprising:

before bringing the mold and the imprint material on a target shot region for the imprint process into contact with each other, obtaining a first relative position indicating a relative position between the target shot region and the mold, and performing first alignment between the target shot region and the mold by driving a correction unit configured to correct the first relative position;

after bringing the mold and the imprint material on the target shot region into contact with each other, performing second alignment between the target shot region and the mold by driving the correction unit; and performing the imprint process on the target shot region after the second alignment, wherein the first alignment for the target shot region includes alignment performed based on a correction amount by the correction unit in the second alignment for another shot region where the imprint process has been performed earlier than in the target shot region and a second relative position indicating a relative position between the another shot region and the mold after the first alignment for the another shot region.

2. The method according to claim 1, wherein the another shot region is a shot region on a same substrate as the target shot region.

3. The method according to claim 2, wherein the another shot region is a shot region immediately preceding the target shot region in an order of the imprint process.

4. The method according to claim 1, wherein the another shot region is a shot region on another substrate belonging to a same lot as the substrate.

5. The method according to claim 4, wherein the shot region on the another substrate is a shot region where the imprint process has been performed lastly on the another substrate.

6. The method according to claim 1, wherein a correction amount by the correction unit in the first alignment for the target shot region is determined by correcting the first relative position with a difference between a correction amount by the correction unit in the second alignment for the another shot region and the second relative position.

7. The method according to claim 1, wherein the correction unit includes at least one of a substrate driving mechanism configured to drive a substrate stage which holds the substrate, a mold driving mechanism configured to drive a mold holding unit which holds the mold, a substrate correction mechanism configured to correct a shape of the substrate, and a mold correction mechanism configured to correct a shape of the mold.

8. The method according to claim 1, wherein obtaining the relative position includes performing a statistical process of estimating each position of the plurality of shot regions from measurement results of positions of some shot regions out of the plurality of shot regions.

9. A method of manufacturing an article, the method comprising:

forming a pattern on a substrate by an imprint method of performing an imprint process of forming a pattern of an imprint material by using a mold on each of a plurality of shot regions of the substrate; and processing the substrate, on which the pattern has been formed, to manufacture the article, wherein the imprint method comprises:

before bringing the mold and the imprint material on a target shot region for the imprint process into contact with each other, obtaining a first relative position indicating a relative position between the target shot region and the mold, and performing first alignment between the target shot region and the mold by driving a correction unit configured to correct the first relative position;

after bringing the mold and the imprint material on the target shot region into contact with each other, performing second alignment between the target shot region and the mold by driving the correction unit; and performing the imprint process on the target shot region after the second alignment, wherein the first alignment for the target shot region includes alignment performed based on a correction amount by the correction unit in the second alignment for another shot region where the imprint process has been performed earlier than in the target shot region and a second relative position indicating a relative position between the another shot region and the mold after the first alignment for the another shot region.

* * * * *